(12) United States Patent
Clark et al.

(10) Patent No.: US 8,178,841 B2
(45) Date of Patent: May 15, 2012

(54) MONOLITHICALLY INTEGRATED IR IMAGING USING RARE-EARTH UP CONVERSION MATERIALS

(75) Inventors: Andrew Clark, Los Altos, CA (US); Robin Smith, Mountain View, CA (US); Richard Sewell, Palo Alto, CA (US); Scott Semans, Sunnyvale, CA (US)

(73) Assignee: Translucent, Inc., Palo Alto, CA (US)

( * ) Notice: Subject to any disclaimer, the term of this patent is extended or adjusted under 35 U.S.C. 154(b) by 249 days.

(21) Appl. No.: 12/510,977

(22) Filed: Jul. 28, 2009

(65) Prior Publication Data

US 2010/0038541 A1    Feb. 18, 2010

Related U.S. Application Data

(60) Provisional application No. 61/089,786, filed on Aug. 18, 2008.

(51) Int. Cl.
*G01J 1/58*      (2006.01)

(52) U.S. Cl. ............. 250/338.1; 250/339.06; 250/488.1; 250/487.1; 136/243; 136/252; 136/257

(58) Field of Classification Search ............... 250/336.1, 250/338.1, 339.06, 363.01, 365, 372, 488.1, 250/487.1; 136/243, 257
See application file for complete search history.

(56) References Cited

U.S. PATENT DOCUMENTS

| | | | |
|---|---|---|---|
| 3,415,990 A * | 12/1968 | Watson | ................ 250/338.1 |
| 4,842,960 A | 6/1989 | Lindmayer | |
| 4,891,507 A | 1/1990 | Lindmayer | |
| 5,012,098 A | 4/1991 | Lindmayer | |
| 6,541,788 B2 | 4/2003 | Petroff | |
| 6,734,453 B2 | 5/2004 | Atanackovic | |
| 6,858,864 B2 | 2/2005 | Atanackovic | |
| 6,943,385 B2 | 9/2005 | Usuda | |
| 7,008,559 B2 | 3/2006 | Chen | |
| 7,018,484 B1 | 3/2006 | Atanackovic | |
| 7,023,011 B2 | 4/2006 | Atanackovic | |
| 7,037,806 B1 | 5/2006 | Atanackovic | |
| 7,135,699 B1 | 11/2006 | Atanackovic | |
| 7,199,015 B2 | 4/2007 | Atanackovic | |
| 7,199,451 B2 | 4/2007 | Kelman | |
| 7,211,821 B2 | 5/2007 | Atanackovic | |
| 7,217,636 B1 | 5/2007 | Atanackovic | |
| 7,253,080 B1 | 8/2007 | Atanackovic | |
| 7,273,657 B2 | 9/2007 | Atanackovic | |

(Continued)

OTHER PUBLICATIONS

U.S. Appl. No. 11/788,153, Atanackovic, Petar B.

(Continued)

*Primary Examiner* — David Porta
*Assistant Examiner* — Djura Malevic
(74) *Attorney, Agent, or Firm* — Parsons & Goltry; Robert A. Parsons; Michael W. Goltry

(57) ABSTRACT

Infrared imaging at wavelengths longer than the silicon bandgap energy (>1100 nm) typically require expensive focal plane arrays fabricated from compound semiconductors (InSb or HgCdTe) or use of slower silicon microbolometer technology. Furthermore, these technologies are available in relatively small array sizes, whereas silicon focal plane arrays are easily available with 10 megapixels or more array size. A new technique is disclosed to up convert infrared light to wavelengths detectable by silicon focal plane arrays, or other detector technologies, thereby enabling a low-cost, high pixel count infrared imaging system.

16 Claims, 8 Drawing Sheets

U.S. PATENT DOCUMENTS

| | | | |
|---|---|---|---|
| 7,351,993 | B2 | 4/2008 | Atanackovic |
| 7,384,481 | B2 | 6/2008 | Atanackovic |
| 7,416,959 | B2 | 8/2008 | Atanackovic |
| 7,501,627 | B1 | 3/2009 | Herr |
| 8,039,736 | B2 * | 10/2011 | Clark et al. .................. 136/257 |
| 8,039,738 | B2 * | 10/2011 | Clark et al. .................. 136/257 |
| 2005/0161773 | A1 | 7/2005 | Atanackovic |
| 2005/0163692 | A1 | 7/2005 | Atanackovic |
| 2006/0022139 | A1 * | 2/2006 | Garber et al. ............... 250/330 |
| 2006/0060826 | A1 | 3/2006 | Atanackovic |
| 2008/0217695 | A1 | 9/2008 | Atanackovic |
| 2008/0241519 | A1 | 10/2008 | Shroeder |
| 2008/0286949 | A1 | 11/2008 | Atanackovic |
| 2008/0308143 | A1 | 12/2008 | Atanackovic |
| 2009/0001329 | A1 | 1/2009 | Atanackovic |
| 2010/0243051 | A1 * | 9/2010 | Slager ......................... 136/257 |
| 2010/0288344 | A1 * | 11/2010 | Spitzer ........................ 136/255 |
| 2012/0012166 | A1 * | 1/2012 | Atanackovic ................ 136/252 |

OTHER PUBLICATIONS

U.S. Appl. No. 11/828,964, Atanackovic, Petar B.
U.S. Appl. No. 11/858,838, Atanackovic, Petar B.
U.S. Appl. No. 11/873,387, Atanackovic, Petar B.
U.S. Appl. No. 12/171,200, Atanackovic, Petar B.
U.S. Appl. No. 12/408,297, Clark, Andrew.
Auzel, F.; "1.5 μm high detectivity quantum coounter by energy transfers in diode pumped glassceramics"; Revue Phys.Appl. 20(1985) 273.
Auzel, F.; "Upconversion and Anti-Stokes Processes with f and d Ions in Solids"; Chem. Rev. 2004, 104, 139.
Bloembergen, N.; "Solid State Infrared quantum counters"; Phy.Rev. Letters (2), 3, Feb. 1, 1959, 84.
Boyd, R.W.; "Efficient infrared imaging upconversion via quantum coherence"; App.Phy.Let.; (77), 22, Nov. 27, 2000, 3559.
Librantz, A.F.H.;"Pump excited state adsorption in holmium-doped fluoride glass";Jl.App.Phy., (103) 023105, (2008) 103.
Sandoval, J.; "Er-doped silica dynamic IR-to-visible image converter"; Infrared Phy. & Tech. 46 (2004) 141.
Dos Santos, P.V.; "Optical temperature sensing using upconversion fluorescence emission in $Er^{3+}/Yb^{3+}$-codoped chalcogenide glass"; App.Phy.Lett.; (73) 5, Aug. 3, 1998.
Wu, Le Ke; "Dual-band pixelless upconversion imaging devices"; Optics Lett, (32) 16, Aug. 15, 2007, 2366.

* cited by examiner

Figure 1    Integrated upconversion device

Figure 2 Integrated up conversion device using repeating bi-layers of REO material Figure 3 Integrated up conversion device using repeating bi-layers of REO material and integrated Distributed Bragg Reflector Figure 4 Rare-earth ions showing useful transitions for upconversion via ESA. The resulting emission wavelength is shown in the contour lines.

Figure 5 Rare-earth ions showing useful transitions for up conversion via ESA. The resulting emission wavelength is shown in the contour lines.

Exemplary doping profile, showing active RE ion doping coinciding with peaks in the optical standing wave produced in the film due to optical interference.

Figure 7    Exemplary dual wavelength imaging system.
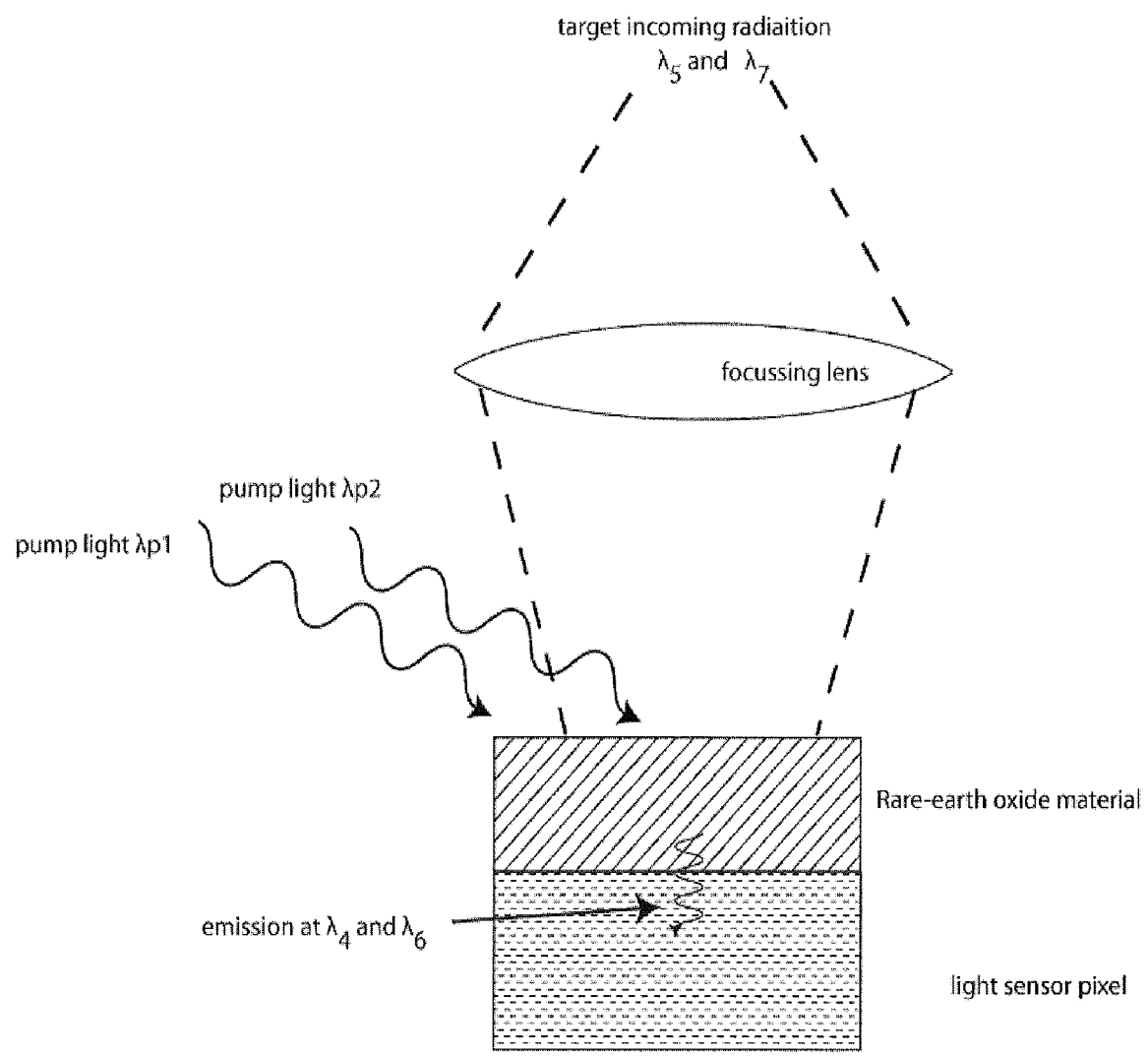

Figure 8     Exemplary energy levels in REO and semiconductor detector.
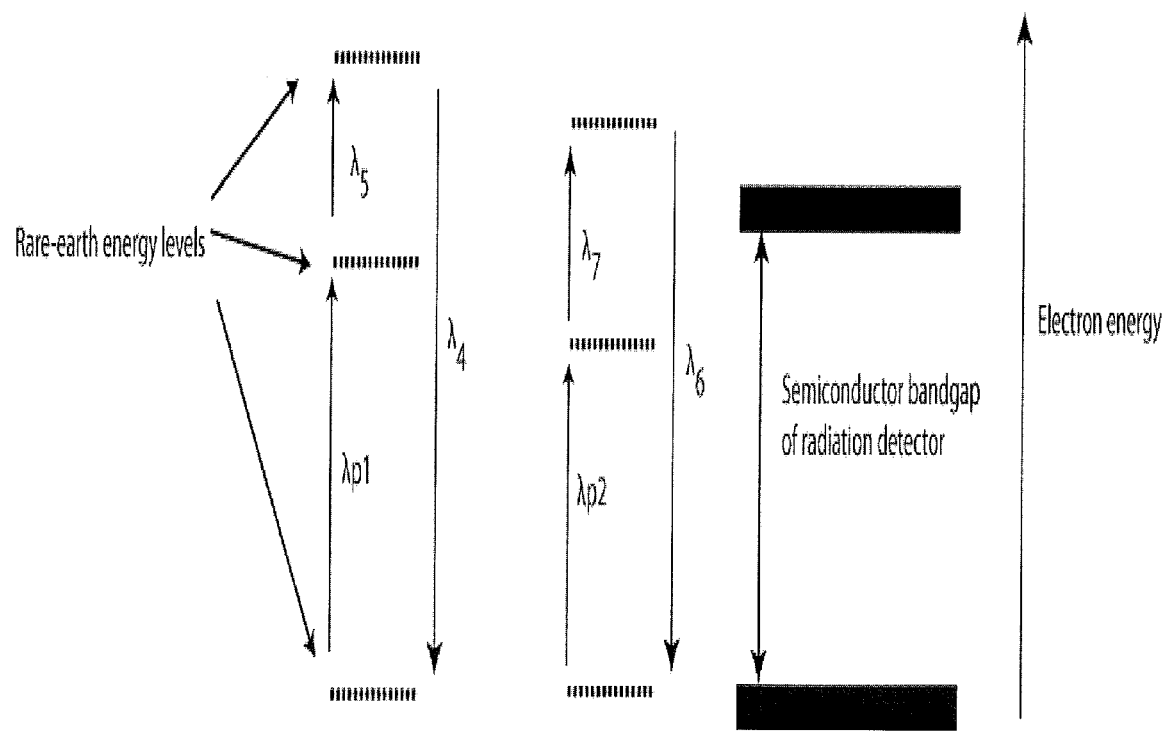

MONOLITHICALLY INTEGRATED IR IMAGING USING RARE-EARTH UP CONVERSION MATERIALS

PRIORITY

This application claims priority to U.S. 61/089,786 filed on Aug. 18, 2008.

CROSS REFERENCE TO RELATED APPLICATIONS

Applications and patent Ser. Nos. 09/924,392, 10/666,897, 10/746,957, 10/799,549, 10/825,912, 10/825,974, 11/022, 078, 11/025,363, 11/025,680, 11/025,681, 11/025,692, 11/025,693, 11/084,486, 11/121,737, 11/187,213, U.S. 20050166834, U.S. 20050161773, U.S. 20050163692, Ser. Nos. 11/053,775, 11/053,785, 11/054,573, 11/054,579, 11/054,627, 11/068,222, 11/188,081, 11/253,525, 11/254, 031, 11/257,517, 11/257,597, 11/393,629, 11/398,910, 11/472,087, 11/788,153, 11/858,838, 11/960,418, 12/119, 387, 60/820,438, 60/811,311, 12/408,297, 12/171,200, 12/119,387, 60/847,767, 60/944,369, 60/949,753, U.S. Pat. No. 7,018,484, U.S. Pat. No. 7,037,806, U.S. Pat. No. 7,135, 699, U.S. Pat. No. 7,199,015, all held by the same assignee, contain information relevant to the instant invention and are included herein in their entirety by reference. References, noted at the end, are included herein in their entirety by reference.

BACKGROUND OF THE INVENTION

1. Field of the Invention

The invention relates generally to a device structure for up and down conversion of radiation, typically infra-red, wherein low energy wavelengths are up converted to higher energy to improve adsorption by a photosensitive device.

2. Description of Related Art Including Information Disclosed Under 37 CFR 1.97 and 1.98

U.S. Pat. No. 4,842,960 U.S. Pat. No. 4,891,507 U.S. Pat. No. 6,541,788 U.S. Pat. No. 7,008,559

There is considerable interest in up conversion of infrared to shorter wavelength light, for various applications. The approaches currently described in prior art fall into the following broad categories which take fundamentally different approaches to the problem.

Sandoval [Sandoval_IRPT_04] describes a system for thermal imaging using emission from rare earth doped glass fibers. In this system, infrared radiation from the target is focused onto a rare-earth doped fiber, creating local fluctuations in temperature. The fiber is pumped with 800 nn light giving rise to steady state emission at 520-550 nm. The infrared light impinging transversely on the fiber generates local variations in temperature of the fiber which shifts the spectrum of the emission. In this scheme the target infrared light does not directly take part in the up conversion process, as different to this application.

Chen, U.S. Pat. No. 7,008,559, describes a biological imaging system where rare-earth containing nano-particles are attached or combined within objects of interest and made to fluoresce when irradiated. The instant invention does not require attachment or embedding of a fluorescent material to a target.

Boyd [Boyd-00] and others, using non-linear optical crystals such a $LiNiO_3$ or atomic vapors (Na for example) to sum a pump light energy with a target infrared light energy to up convert for imaging. The up conversion process described in the prior art is via second and third order non linear optical interactions which take place in entirely different materials than those disclosed in the present work.

Another scheme for up conversion is described in [Wu-optics letters 2007] and U.S. Pat. No. 6,541,788. In these methods, infrared light is absorbed within quantum dot structures, to create electrical carriers which then emit light via an adjacent light emitting diode (LED). In this work no LED structure is present; light emission is via atomic transitions in excited rare earth, RE, ions, not band-to-band radiative recombination as in a LED.

Up conversion plates for image intensifiers have been described by Lindemayer in U.S. Pat. No. 4,891,507 and U.S. Pat. No. 4,842,960. The prior art discloses RE materials within a CaS or SrS host, which must be pre-charged from a light source to trap electrons within the material. The present invention neither requires pre-charging, nor does it embody CaS or SrS host materials. Furthermore, the fundamental mechanism for generating the up converted light is fundamentally different, i.e. these materials rely on electrons being transferred to trapping sites by a pre-charge light, with electrons released from these levels by the infrared radiation.

[Auzel-Chem-reviews]—Describes an up conversion scheme where a vitroceramic phosphor material is used as an up converting layer. The present work confines itself to a solid film layer deposited upon a detector, optionally silicon.

[Bloembergen] Describes IR sensing via ESA, where excitation to a first excited state is provided by the target radiation, which then enables ESA of shorter wavelength light. Furthermore, the scheme of Bloembergen requires that a fourth energy level be present so that up converted light may be discriminated from pump light. The instant invention requires no fourth level, and the pump wavelength is discriminated by virtue of it being longer than the cutoff wavelength of the semiconductor detector.

[Auzel-Revue-Phys-Appl] Auzel reports a Yb—Er co-doped vitroceramic pumped at 960 nm for detection of 1550 nm radiation via detection of 660 nm red radiation resulting from up conversion. Auzel does not disclose the up conversion material deposited on a silicon detector; nor does Auzel disclose a pumping wavelength that is out of the detector bandwidth; nor does Auzel disclose an integrated filter structure such as a DBR.

It is well known that certain materials containing rare-earth ions are capable of up converting infrared light to visible light. Typically up conversion is concerned with converting one wavelength of light to a shorter wavelength of light, an example is up converting 1550 nm light to 980 nm light in Erbium doped materials.

Infrared imaging is an important technology especially for defense, security and chemical sensing applications. The high cost of such systems often precludes their use in many commercial, medical and domestic applications where such technology may prove useful. The present invention discloses a method to supplement a conventional CMOS or CCD silicon focal plane array as is found in conventional visible imaging systems, to serve as an infrared imaging system. Furthermore the present invention is not limited to silicon-based imaging systems. Detectors based on GaAs, InGaAs, GaN or other semiconductor systems incorporating an integrated up conversion device may also be envisioned. In such a system, the detector is responsive to sub-band gap radiation through the use of an up conversion device as described herein. In some embodiments an up conversion device may not be integrated directly on the detector surface; it may be a distinct layer of material apart from a radiation detector.

BRIEF SUMMARY OF THE INVENTION

The instant invention discloses various embodiments of up conversion devices; for instance, Non-pumped, DC or AC pumped at 1550 nm or different wavelengths, optional buffer layers, optional DBR layers. In some embodiments up conversion, UC, material is positioned in such a way that the luminescence from the UC material can be efficiently coupled into an underlying detector. Ideally UC material is deposited directly on top of a detector array. The UC material is also be positioned in such a way so that light from an infrared target may be focused across the plane of the UC material. A 'pump' source of radiation, either constant or modulated, is supplied such that the pump light impinges upon the UC material. The wavelength(s) of the pump light is selected such that the UC material may absorb this radiation, and excite electrons in the UC material into a higher energy state. The wavelength(s) of the pump light may be selected such that a photo-response is not produced in the semiconductor detector from the pump beam alone. Alternatively the pump beam is time modulated such that the detected signal is out of phase with the pump beam, thereby allowing the signal to be discriminated from the pump. Alternatively, a filter element such as a distributed Bragg reflector, DBR, is disposed between the up conversion layer and the semiconductor detector; a DBR is chosen such that light at the pump wavelength is not sensed by the semiconductor detector. Alternatively a combination of these techniques may be employed to discriminate between detection of a pump light and light arising from up conversion of the infrared signal light. Infrared light from the target object interacts with the excited UC material to excite electrons in the material to a higher energy level. Radiative decay from this level produces photons of sufficient energy to generate an electron-hole pair in a semiconductor detector, thus enabling detection of infrared light at wavelengths not normally detectable with the semiconductor detector. Non-silicon detectors may also be used with appropriately modified UC materials. Other pumping/imaging wavelengths can be used through combinations of RE ions. Up conversion may take place through GSA/ETU or ESA

BRIEF DESCRIPTION OF THE SEVERAL VIEWS OF THE DRAWING(S)

FIG. 7 is an exemplary embodiment with multiple pump light sources and up conversion of incident radiation.

FIG. 8 is a schematic of up conversion process with multiple pump sources.

DETAILED DESCRIPTION OF THE INVENTION

Figure 1:
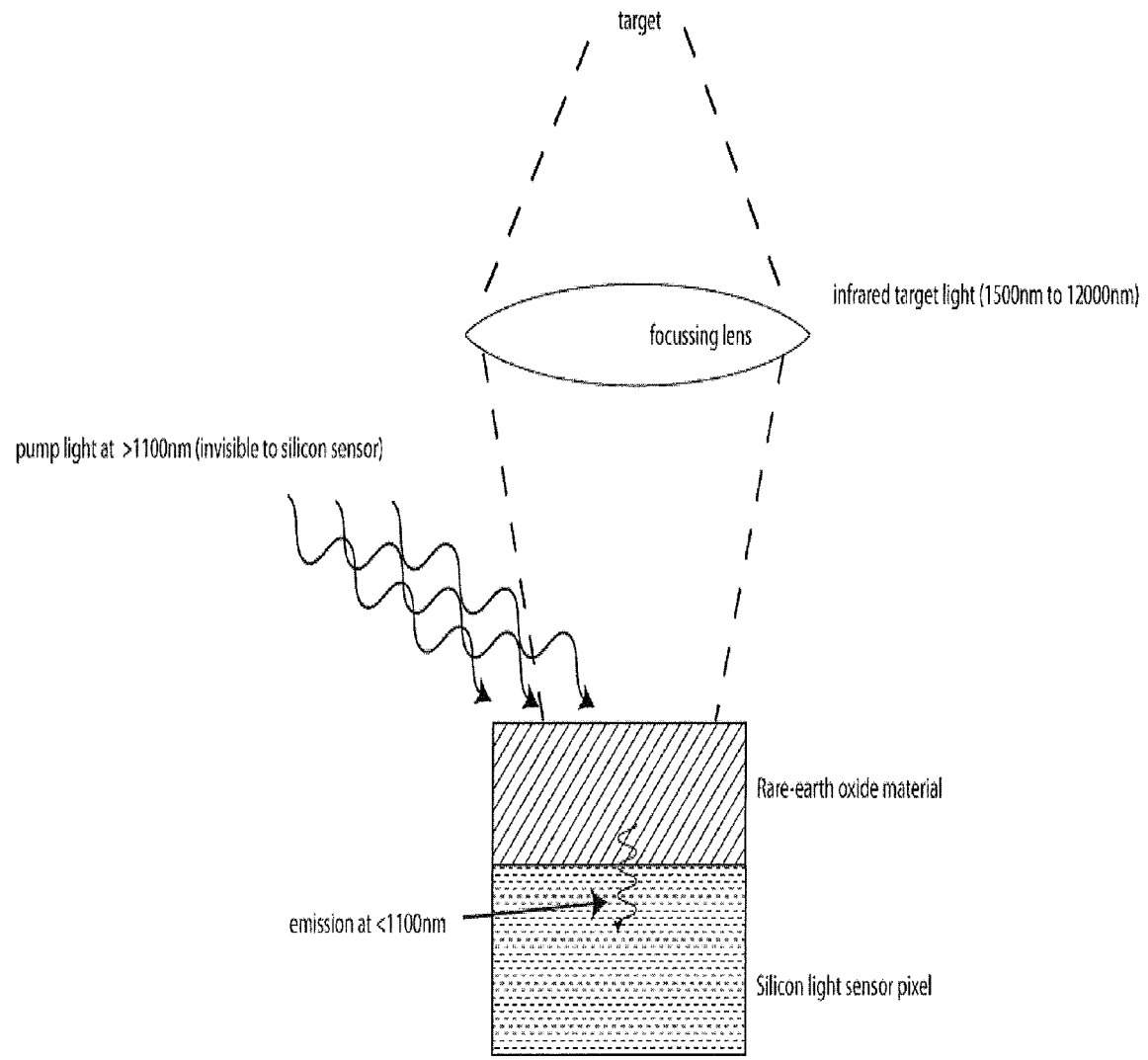
FIG. 1 is a schematic illustration of one embodiment of an integrated up conversion device.
Figure 2:
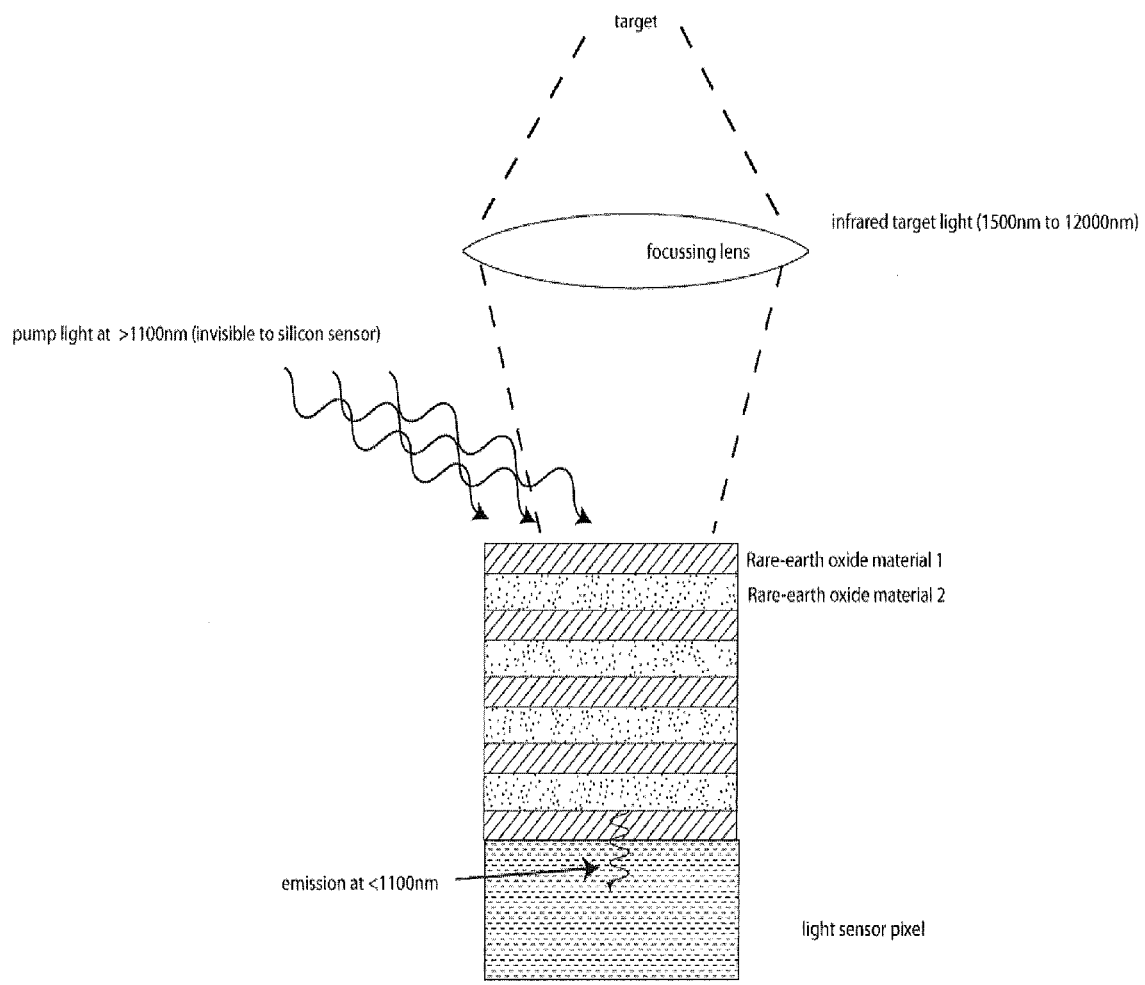
FIG. 2 is a schematic illustration of one embodiment of an integrated up conversion device with multiple rare earth layers.
Figure 3:
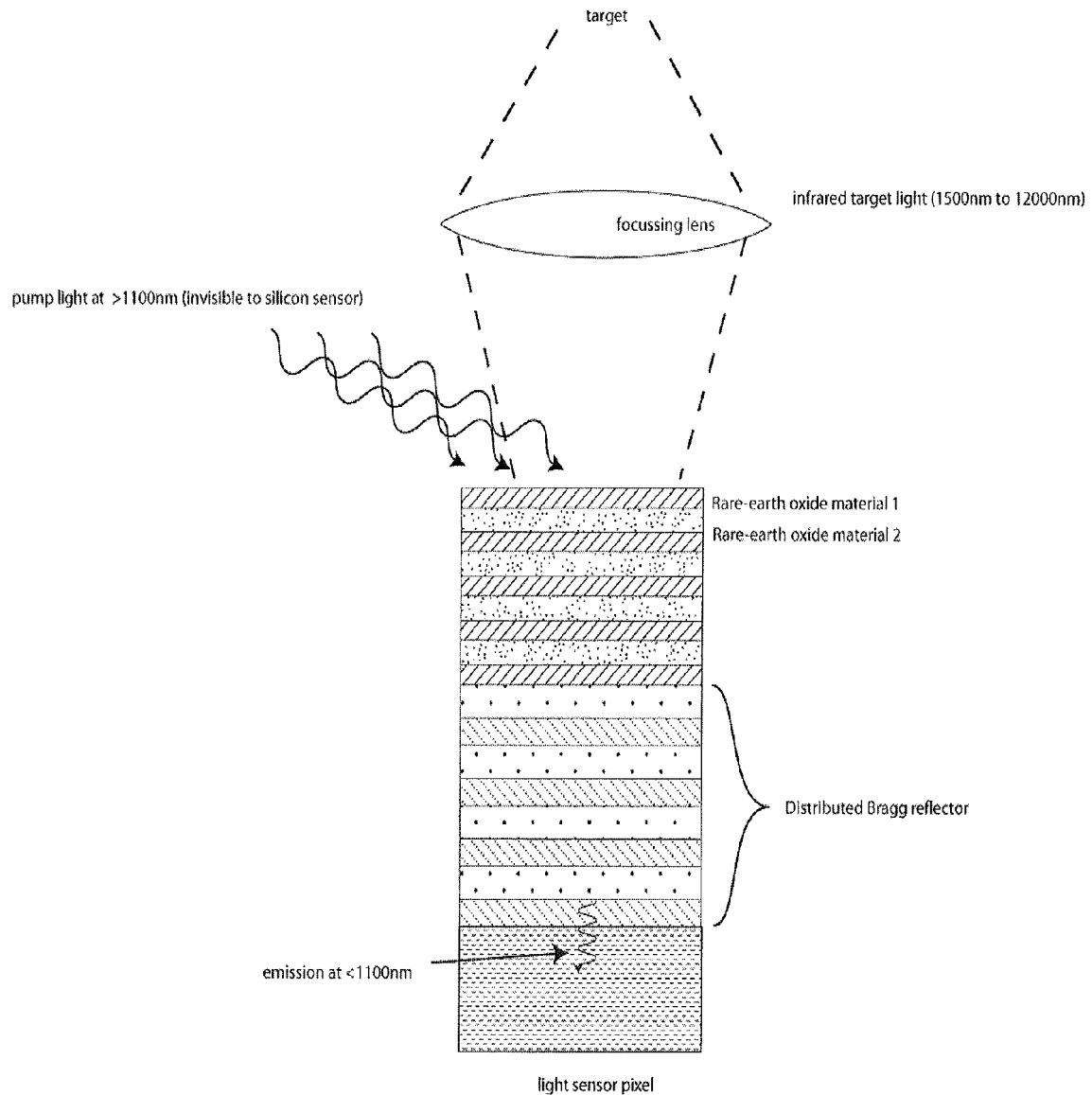
FIG. 3 is a schematic illustration of one embodiment of an integrated up conversion device with repeating bilayers of rare earths and a DBR.
Figure 4:
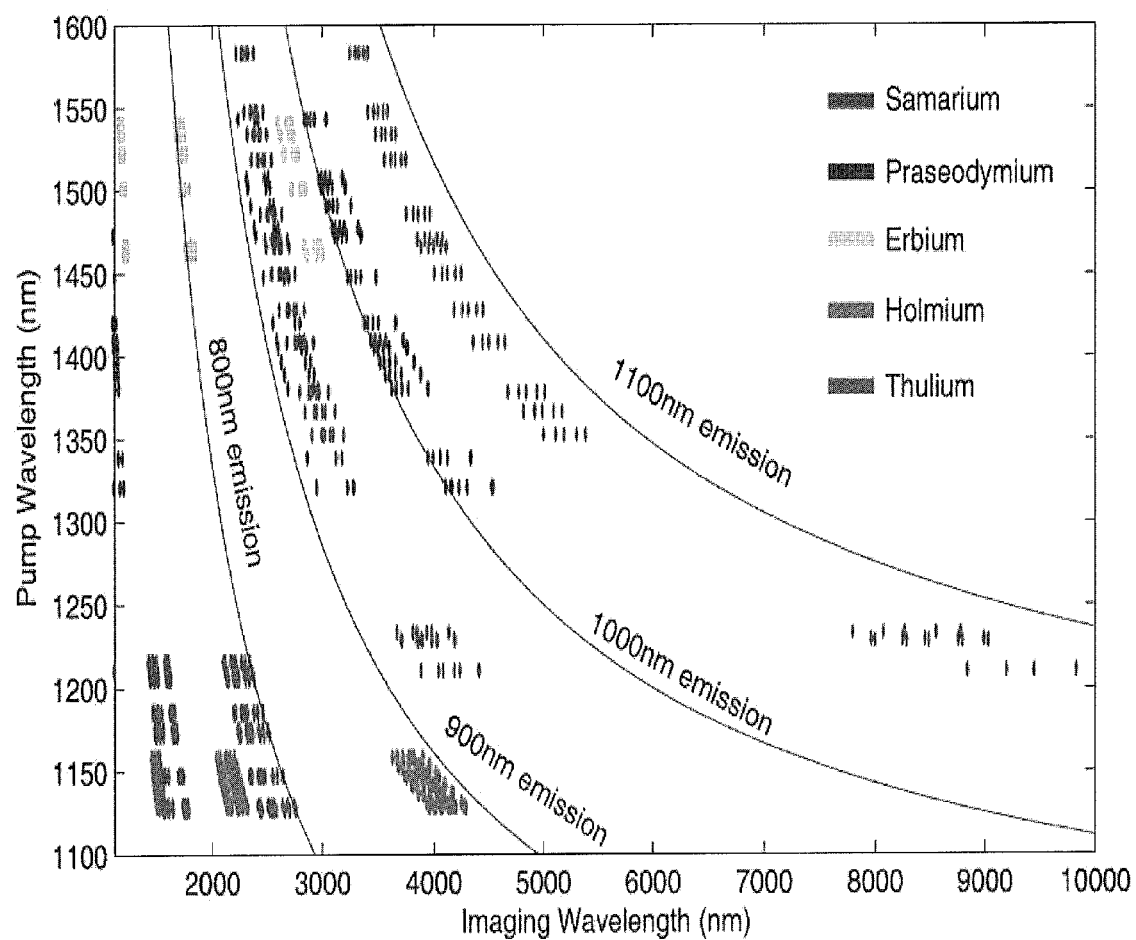
FIG. 4 is a schematic illustration of Rare-earth ions showing useful transitions for up conversion via ESA.
Figure 5:
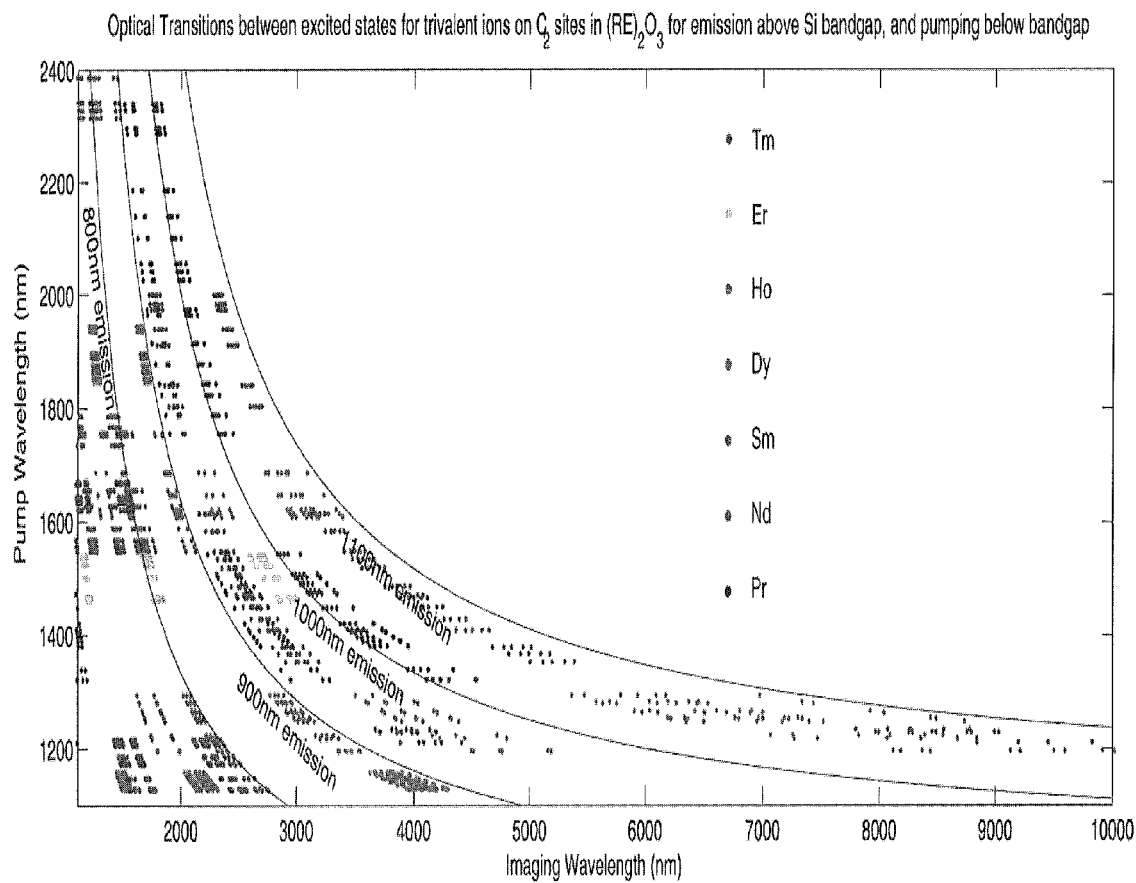
FIG. 5 is a second schematic illustration of Rare-earth ions showing useful transitions for up conversion via ESA.

As used herein [RE1, RE2, . . . RE10] are chosen from the lanthanide series of rare earths from the periodic table of elements consisting of $^{57}$La, $^{58}$Ce, $^{59}$Pr, $^{60}$Nd, $^{61}$Pm, $^{62}$Sm, $^{63}$Eu, $^{64}$Gd, $^{65}$Tb, $^{66}$Dy, $^{67}$Ho, $^{68}$Er, $^{69}$Tm, $^{70}$Yb and $^{71}$Lu, plus yttrium, $^{39}$Y, and scandium, $^{21}$Sc, are included as well for the invention disclosed. Optionally, rare earth oxides, nitrides, and phosphides and/or combinations thereof may be employed. As used herein the terms, "oxides" and "rare-earth oxide[s]" are inclusive of rare earth oxides, nitrides, and phosphides and/or combinations thereof.

A further advantage of the disclosed system is that by utilizing different pump wavelengths, the UC material, or one layer of the UC material may be excited such that the imaging system becomes sensitive to an alternate wavelength of infrared light. For example, by using Er and Dy co-doping with ~1600 nm pump radiation, when a Er ion is excited form ground state to its $^4I_{13/2}$ state, it can be quickly excited further to its $^4I_{11/2}$ state by ETU since the energy spacing between the $^4I_{13/2}$ and $^4I_{11/2}$ states is close to the energy of excited Dy ions in their $^6H_{13/2}$ states. Then consider that a portion of the same UC device is also doped with Ho and Tm. When the pump wavelength is changed to ~1850 nm Ho ions will absorb the pump radiation and become excited from ground state to the $^5I_7$ state. Tm ions are excited from ground state to $^3F_4$ state by absorption of the target radiation at 1650 nm. ETU can then take the energy from an excited Tm ion to further excite a Ho ion into the $^5I_5$ state. A Ho ion in the $^5I_5$ state may then radiatively decay to produce a 870 nm photon which is sensed by a semiconductor detector. In effect this enables a multi-wavelength, pixel-registered IR imaging system, by modulating the pump wavelength. FIGS. 7 and 8 provide exemplary schematics of a dual wavelength imaging detector system employing multiple pump wavelength sources enabling up conversion over an extended wavelength spectrum and exemplary energy levels in REO and semiconductor detector.

Non-Pumped Up Conversion for IR Imaging.

A semiconductor imaging device with integrated RE containing up conversion device. The up conversion device consists of one or more layers of RE containing material. When one layer is used the RE material contains two or more RE species. When a layered UC device is used layers containing two or more RE are interspersed between layers containing at least one RE species so as to limit the resonant energy transfer between active layers containing two or more RE species. In this embodiment, the UC device is illuminated solely by light from the target.

Pumped Up Conversion for IR Imaging

Same device structures as detailed in 1, but in this embodiment, the UC device is illuminated by a secondary 'pump' source of radiation. The pump radiation, $\lambda_p$, is absorbed in the UC device so that certain RE species in the UC device are excited to higher energy states; optionally, more than one pump wavelength is provided, $\lambda_{p1}$ and $\lambda_{p2}$, etc., for example. By exciting the RE atoms UC of the target radiation is enabled, either through Excited State Absorption (ESA) or Ground State Absorption (GSA)/Energy Transfer Up conversion (ETU) GSA/ETU. The pump radiation may be either continuous wave or modulated radiation, where modulated pump radiation may be used to enable synchronous signal recovery techniques.

The pump radiation may be provided by either a LED, superluminescent LED, or laser radiation impinging upon the UC device. The wavelength of the pump radiation may be the same as the target wavelength, in which case either the pump or the target radiation must be modulated in order to recover a signal from the detector. In the case of GSA/ETU up conversion, it is well know that the UC process becomes more efficient as the power density increases. Radiation from the pump can be used to increase the average power density in the UC device, thus allowing additional radiation from the target to be up converted more efficiently.

The radiation from the pump source may also be chosen to be at a wavelength different to the target wavelength. This scheme may be used to either populate the same excited state as the target radiation, in which case a modulation scheme can be used to extract the signal. Alternatively, the pump radiation can be use to excite the RE ions into intermediate states which then enable absorption and up conversion of the target radiation, in a ESA up conversion scheme.

UC Device Structure Incorporating Buffer Layers.

The up conversion device consists of one or more layers of RE containing material. When one layer is used the RE material contains two or more RE species. When a layered UC device is used layers containing two or more RE are interspersed between layers containing at least one RE species so as to limit the resonant energy transfer between active layers containing two or more RE species.

UC Device Structure Incorporating Distributed Bragg Reflector.

The UC device may also incorporate an optical element so that optical radiation within a particular range of wavelengths is selectively reflected back into the UC device, while other wavelengths are selectively transmitted into the semiconductor imaging device. As is well known, alternating layers of different refractive indices can be used to create a Distributed Bragg Reflector (DBR). Such a layer structure may be disposed between the UC layers and the semiconductor detector structure such that wavelengths from the pump and/or the target are reflected back into the UC device, while radiation resulting from up conversion is transmitted through the DBR for detection by the semiconductor detector.

Various Embodiments

Figure 6:
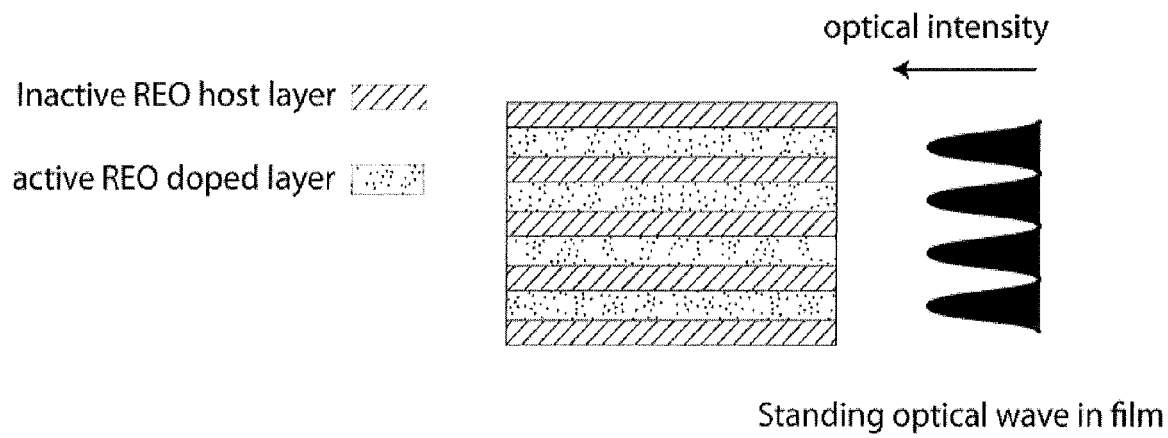
FIG. 6 is a schematic showing inactive versus doped REO layers to enable standing optical waves.

In one embodiment a UC device is grown epitaxially on a silicon detector device, optionally by molecular beam epitaxy, using solid sources or rare-earth elements and molecular oxygen. In this embodiment, a detector device, optionally silicon, and UC device are a monolithically integrated UC imaging device. The UC device comprises active RE ions within a host matrix of RE oxide. The doping profile of the active RE ions need not be uniform and is chosen to (a) suppress resonant energy transfer to quenching sites and (b) coincide with regions of high optical intensity that arise from a standing wave pattern created within the UC layer due to optical interference. The preferred doping profile is also such that the upper and lower surfaces of the UC device do not contain active RE species; FIG. 6 provides one exemplary example of a doping profile, showing active RE ion doping coinciding with peaks in the optical standing wave produced in the film due to optical interference.

In one embodiment, UC takes place via Ground State Absorption/Energy Transfer Up conversion GSA/ETU, such that the pump radiation is absorbed by a ground state absorption, GSA, in one of the active RE ions, and the target radiation is also absorbed by a ground state absorption in the same or a different active RE ion. Up conversion may then proceed via Energy Transfer Up, ETU, conversion, where the energy of one excited RE ion is transferred to another excited RE ion, such that the second RE ion becomes excited to an energy level more than one level above its ground state.

A specific example is an UC device consisting of a $Gd_2O_3$ host matrix doped with Er and Dy for imaging at 1550 nm, with a pump at around 1600 nm. The Dy absorbs the pump radiation at 1600 nm, while Er absorbs the 1550 nm radiation from the target. Through ETU, an Er ion in its $^4I_{13/2}$ state can be excited to its $^4I_{11/2}$ state through energy transfer from the Dy. The $^4I_{11/2}$ state can then decay to ground level through emission of a photon at 980 nm which is detected by a silicon imaging device.

In all examples listed herein it is disclosed that a rare earth layer(s) for up converting occurs with one or more layers comprising one or more rare earths in combination with one or more elements chosen from the group comprising oxygen, nitrogen, phosphorus, silicon, germanium, and carbon. A rare earth layer may be grown on a single crystal substrate or not; the substrate may be silicon or not; a rare earth layer for converting may be transferred to a different substrate for the converting. A rare earth layer may be deposited as single crystal, or multi-crystalline, amorphous or quantum dots; subsequent processing may be required to change a physical state of a rare earth layer to make it suitable for up converting, such as converting an amorphous layer to a large grained layer. A rare earth layer for up converting may be used in combination with one or more reflectors, Bragg layers, textured layers, or other optical components known to one knowledgeable in the field. In some embodiments a rare earth layer for up converting is also a reflector layer, Bragg layer, and/or textured layer.

In one embodiment a device for detecting incoming radiation comprises a first region comprising one or more layers each comprising a rare earth; and a radiation detector operable between wavelengths $\lambda_1$ and $\lambda_2$ wherein $\lambda_2$ is greater than $\lambda_1$ and the first region is between the incoming radiation and the radiation detector such that the first region is operable to convert at least a portion of the incoming radiation from wavelength $\lambda_3$ to $\lambda_4$ wherein $\lambda_3$ is greater than $\lambda_2$ and $\lambda_1 \leq \lambda_4 \leq \lambda_2$; optionally, a device has a range of $\lambda_1$ from about 300 nm to about 1,000 nm; $\lambda_2$ has a range from about 800 nm to about 1,400 nm; and $\lambda_3$ has a range from about 1,000 nm to about 12,000 nm; optionally, a device has a first region comprising at least one layer comprising two or more rare earths; optionally, a device has a first region comprising a first and second layer such that the first layer comprises at least two rare earths and the second layer comprises at least one rare earth; optionally, a device comprises a second region between said first region and said radiation detector operable as a distributed Bragg reflector.

In one embodiment a device for detecting incoming radiation comprises a radiation detector operable between wavelengths $\lambda_1$ and $\lambda_2$ wherein $\lambda_2$ is greater than $\lambda_1$; and a first region of one or more layers each comprising a rare earth, such that the radiation detector is between the incoming radiation and the first region and the first region is operable to convert at least a portion of the incoming radiation from wavelength $\lambda_3$ to $\lambda_4$ wherein $\lambda_3$ is greater than $\lambda_2$ and $\lambda_1 \leq \lambda_4 \leq \lambda_2$; optionally, a device has a range of $\lambda_1$ from about 300 nm to about 1,000 nm; $\lambda_2$ has a range from about 800 nm to about 1,400 nm; and $\lambda_3$ has a range from about 1,000 nm to about 12,000 nm; optionally, a device comprises a first region comprising one layer comprising two or more rare earths; optionally, a device comprises a first region comprising a first and second layer such that the first layer comprises two or more rare earths and the second layer comprises one or more rare earths.

In one embodiment an apparatus for detecting incoming radiation comprises a device for emitting pump radiation of wavelength, $\lambda_p$, into the radiation detector; a first region of one or more layers each comprising a rare earth; and a radiation detector operable between wavelengths $\lambda_1$ and $\lambda_2$ wherein $\lambda_2$ is greater than $\lambda_1$ and the first region is between the incoming radiation and the radiation detector such that the first region is operable to convert at least a portion of the pump radiation from wavelength $\lambda_p$ to $\lambda_4$ and the first region is operable to convert at least a portion of the incoming radiation from wavelength $\lambda_3$ to $\lambda_5$ wherein $\lambda_3$ is greater than $\lambda_2$ and less than $\lambda_4$ and $\lambda_1 \leq \lambda_5 \leq \lambda_2$; optionally, an apparatus has pump radiation of wavelength, $\lambda_p \geq 1{,}100$ nm; optionally, an apparatus as has pump radiation of wavelength, $\lambda_p \leq 1{,}100$ nm; optionally, an apparatus has a first region comprising one layer comprising two or more rare earths; optionally, an apparatus has a first region comprising a first and second layer such that the first layer comprises two or more rare earths and the second layer comprises one or more rare earths.

In one embodiment an apparatus for detecting incoming radiation comprises a device for emitting pump radiation of wavelengths, $\lambda_{p1}$ and $\lambda_{p2}$ into the radiation detector; a first region comprising a plurality of layers each comprising a rare earth; and a radiation detector operable between wavelengths $\lambda_1$ and $\lambda_2$ wherein $\lambda_2$ is greater than $\lambda_1$ and the first region is between the incoming radiation and the radiation detector such that the first region is operable to convert at least a portion of the pump radiation from wavelength $\lambda_{p1}$ to $\lambda_4$ in the presence of incoming radiation $\lambda_5$ and from $\lambda_{p2}$ to $\lambda_6$ in the presence of incoming radiation $\lambda_7$, wherein $\lambda_1 \leq \lambda_4$, $\lambda_6 \leq \lambda_2$ and $\lambda_2 \leq \lambda_{p1} \leq \lambda_{p2}$; optionally, an apparatus has pump radiation of wavelength, $\lambda_{p2} \leq 3{,}000$ nm; optionally, an apparatus has a plurality of layers comprising at least one layer comprising two or more rare earths; optionally, an apparatus has a second region between said first region and said radiation detector operable as a distributed Bragg reflector.

The foregoing described embodiments of the invention are provided as illustrations and descriptions. They are not intended to limit the invention to a precise form as described. In particular, it is contemplated that functional implementation of invention described herein may be implemented equivalently in hardware and/or various combinations of hardware and software and/or other available functional components or building blocks. Other variations and embodiments are possible in light of above teachings to one knowledgeable in the art, and it is thus intended that the scope of invention not be limited by this Detailed Description, but rather by Claims following. All patents, patent applications, and other documents referenced herein are incorporated by reference in their entirety for all purposes, unless otherwise indicated.

REFERENCES

[Sandoval_IRPT_04] J. Sandoval, G. Paez, M. Strojnik "Er-doped silica IR-to-visible image converter" *Infrared Phys. Techn.* 46 (2004) 141-145

[Boyd APL_00] R. Boyd "Efficient infrared imaging up conversion via quantum coherence" *Appl. Phys. Lett.* 77 (2000) 3559-3561

[Wu-optics letters 2007] L. K. Wu, H. L. Hao, W. Z. Shen, G. Ariyawansa, A. G. Unil Perera, S. G. Matsik "Dual-band pixelless up conversion imaging devices" *Opt. Lett.* 32 (2007) 2366-2368

[Auzel-Chem-Reviews] F. Auzel "Up conversion and Anti-Stokes Processes with f and d Ions in Solids", *Chemical Reviews*. 104 (2004) 139-174

[Auzel-Revue-Phys-Appl] F. Auzel, P. A. Santa-Cruz and G. F. de Sá "1.5 um high detectivity quantum counter by energy transfers in diode pumped glassceramics", *Revue Phys. Appl.* 20 (1985) 273-281

[Bloembergen] N. Bloembergen "Solid State Infrared Quantum Counters", *Physical Review Letters,* 2 (1959) 84-85

We claim:

1. A device for detecting incoming radiation comprising:
    a first region comprising one or more single crystal layers each comprising a rare earth oxide; and
    a radiation detector including a layer of single crystal silicon and operable between wavelengths $\lambda_1$ and $\lambda_2$ wherein $\lambda_2$ is greater than $\lambda_1$ and the first region is between the incoming radiation and deposited directly on the layer of single crystal silicon of the radiation detector such that the first region is operable to convert at least a portion of the incoming radiation from wavelength $\lambda_3$ to $\lambda_4$ wherein $\lambda_3$ is greater than $\lambda_2$ and $\lambda_1 \leq \lambda_4 \leq \lambda_2$.

2. The device of claim 1 wherein $\lambda_1$ has a range from about 300 nm to about 1,000 nm; $\lambda_2$ has a range from about 800 nm to about 1,400 nm; and $\lambda_3$ has a range from about 1,000 nm to about 12,000 nm.

3. The device of claim 1 wherein said first region comprises at least one layer comprising two or more rare earths.

4. The device of claim 1 wherein said first region comprises a first and second layer such that the first layer comprises at least two rare earths and the second layer comprises at least one rare earth.

5. A device for detecting incoming radiation comprising:
    a radiation detector including a layer of single crystal silicon and operable between wavelengths $\lambda_1$ and $\lambda_2$ wherein $\lambda_2$ is greater than $\lambda_1$; and
    a first region of one or more single crystal layers deposited directly on the layer of single crystal silicon and each of one or more single crystal layers comprising a rare earth oxide, such that the radiation detector is between the incoming radiation and the first region and the first region is operable to convert at least a portion of the incoming radiation from wavelength $\lambda_3$ to $\lambda_4$ wherein $\lambda_3$ is greater than $\lambda_2$ and $\lambda_1 \leq \lambda_4 \leq \lambda_2$.

6. The device of claim 5 wherein $\lambda_1$ has a range from about 300 nm to about 1,000 nm; $\lambda_2$ has a range from about 800 nm to about 1,400 nm; and $\lambda_3$ has a range from about 1,000 nm to about 12,000 nm.

7. The device of claim 5 wherein said first region comprises one single crystal layer comprising two or more rare earths oxides.

8. The device of claim 5 wherein said first region comprises a first and second single crystal layer such that the first layer comprises two or more rare earths and the second layer comprises one or more rare earths.

9. An apparatus for detecting incoming radiation comprising:
    a first region including one or more single crystal layers of a rare earth oxide;
    a device for emitting pump radiation of wavelength $\lambda_p$ into the first region; and
    a radiation detector including a single crystal silicon substrate and operable between wavelength $\lambda_1$ and $\lambda_2$ wherein $\lambda_2$ is greater than $\lambda_1$ and the first region is between the incoming radiation and deposited directly on the single crystal silicon substrate such that the first region is operable to convert at least a portion of the pump radiation from wavelength $\lambda_p$ to $\lambda_4$ and the first region is operable to convert at least a portion of the incoming radiation from wavelength $\lambda_3$ to $\lambda_5$ wherein $\lambda_3$ is greater than $\lambda_2$ and less than $\lambda_4$ and $\lambda_1 \leq \lambda_5 \leq \lambda_2$.

10. An apparatus as in claim 9 wherein said pump radiation is of wavelength $\lambda_p > 1{,}100$ nm.

11. An apparatus as in claim 9 wherein said converted pump radiation is of wavelength $\lambda_4 < 1{,}100$ nm.

12. An apparatus as in claim 9 wherein said first region comprises two or more rare earths.

13. An apparatus as in claim 9 wherein said first region comprises a first and second layer such that the first layer comprises two or more rare earths and the second layer comprises one or more rare earths.

14. An apparatus for detecting incoming radiation comprising:
- a first region comprising a plurality of single crystal layers each comprising a rare earth oxide;
- a device for emitting pump radiation of wavelength $\lambda_{p1}$ and $\lambda_{p2}$ into the first region; and
- a radiation detector including a single crystal silicon substrate and operable between wavelength $\lambda_1$ and $\lambda_2$ wherein $\lambda_2$ is greater than $\lambda_1$ and the first region is deposited directly on the single crystal silicon substrate between the incoming radiation and the radiation detector such that the first region is operable to convert at least a portion of the pump radiation from wavelength $\lambda_{p1}$ to $\lambda_4$ in the presence of incoming radiation $\lambda_5$ and from wavelength $\lambda_{p2}$ to $\lambda_6$ in the presence of incoming radiation $\lambda_7$, wherein $\lambda_1 \leq \lambda_4$, $\lambda_6 \leq \lambda_2$ and $\lambda_2 \leq \lambda_{p1} \leq \lambda_{p2}$.

15. An apparatus as in claim 14 wherein said pump radiation is of wavelength $\lambda_{p2} \leq 3,000$ nm.

16. An apparatus as in claim 14 wherein said plurality of layers comprises at least one single crystal layer comprising two or more rare earths.

* * * * *